US006948555B1

(12) United States Patent
Garcia (10) Patent No.: US 6,948,555 B1
(45) Date of Patent: Sep. 27, 2005

(54) HEAT DISSIPATING SYSTEM AND METHOD

(75) Inventor: Philip Garcia, Saratoga, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1 day.

(21) Appl. No.: 10/874,408

(22) Filed: Jun. 22, 2004

(51) Int. Cl.[7] .................................................. F28F 7/00
(52) U.S. Cl. ................. 165/80.3; 165/185; 361/697; 361/703; 361/710; 257/706; 174/16.3
(58) Field of Search ................................ 165/80.3, 185, 165/104.33; 361/695, 697, 704, 710; 257/706, 257/722; 174/16.3

(56) References Cited

U.S. PATENT DOCUMENTS

| | | | | |
|---|---|---|---|---|
| 4,505,326 A | * | 3/1985 | Hazen | .................... 165/45 |
| 5,816,319 A | * | 10/1998 | Kamekawa et al. | ......... 165/121 |
| 6,031,721 A | * | 2/2000 | Bhatia | ........................ 361/695 |
| 6,152,214 A | * | 11/2000 | Wagner | ...................... 165/121 |
| 6,157,539 A | * | 12/2000 | Wagner et al. | .............. 361/704 |
| 6,244,331 B1 | * | 6/2001 | Budelman | .................. 165/80.3 |
| 6,422,303 B1 | * | 7/2002 | Ishida et al. | ............... 165/80.3 |
| 6,625,021 B1 | * | 9/2003 | Lofland et al. | ............. 361/697 |
| 6,698,499 B1 | * | 3/2004 | Wagner et al. | ............. 165/80.3 |
| 6,698,505 B2 | * | 3/2004 | Lopatinsky et al. | ........ 165/122 |
| 6,809,926 B2 | * | 10/2004 | Liu | ............................ 361/697 |

* cited by examiner

Primary Examiner—Terrell Mckinnon (57) ABSTRACT

Embodiments of the present invention recite a heat dissipating system. In one embodiment, a heatsink comprising a plurality of cooling elements substantially encases a fan assembly disposed therein. When in operation, at least a portion of intake air for the fan assembly is caused to traverse the plurality of cooling elements prior to being exhausted from the fan assembly.

17 Claims, 9 Drawing Sheets

HEAT DISSIPATING SYSTEM AND METHOD

TECHNICAL FIELD

Embodiments of the present invention relate to a method and apparatus for increasing the efficiency of a fan system.

BACKGROUND ART

Electronic equipment often require extra cooling to transfer and dissipate the heat generated by the various components such as microprocessors. One commonly used mechanism for removing heat from a product such as a computer is a motor-driven fan in conjunction with a heatsink.

Figure 1A:
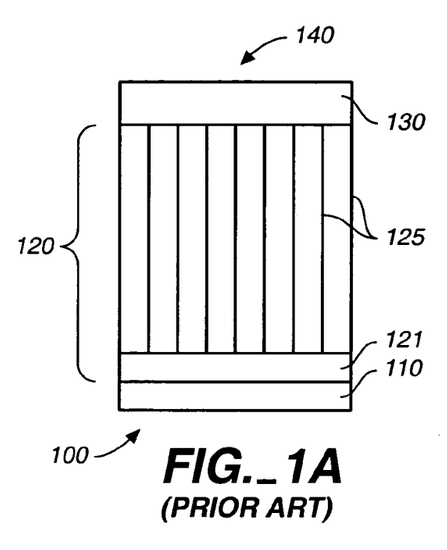
FIGS. 1A and 1B are front and side views respectively of an exemplary heat removal system.
Figure 1B:
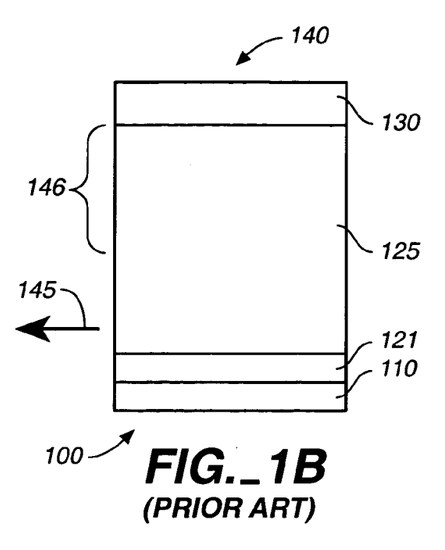

FIGS. 1A and 1B are front and side views respectively of an exemplary conventional heat removal system 100. Typically, heat generated by semiconductor device 110 is transferred via conduction to a heatsink 120 comprising a plurality of fins, typically shown as 125, that in turn dissipate the heat via convection. A fan 130 mounted on the heatsink 120 draws ambient air, depicted by arrow 140, into itself. The outflow air, depicted by arrow 145, from fan 130 generates forced air convection at the heatsink fins 125, thus conveying the heat away from heatsink 120.

One problem with system 100 is that some of the outflow air 145 does not traverse the entire length of fins 125 and instead passes out of the side of heatsink 120 at region 146. As a result, only a fraction of the available outflow air 145 passes over heatsink fins 125 and cooling efficiency is reduced.

Thus there is a need for a heat dissipation system which removes heat from a heatsource more efficiently. These needs are met by embodiments of the present invention.

DISCLOSURE OF THE INVENTION

Embodiments of the present invention recite a heat dissipating system. In one embodiment, a heatsink comprising a plurality of cooling elements substantially encases a fan assembly disposed therein. When in operation, at least a portion of intake air for the fan assembly is caused to traverse the plurality of cooling elements prior to being exhausted from the fan assembly.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

MODES FOR CARRYING OUT THE INVENTION

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Embodiments of the present invention comprise an assembly and method for heat dissipation in which a fan assembly is disposed in a cavity within a heatsink. In embodiments of the present invention, intake air for the fan assembly first traverses the cooling elements of the heatsink prior to being exhausted from the fan assembly. Furthermore, in embodiments of the present invention, the intake air for the fan assembly traverses the cooling elements of the heatsink after being exhausted from the fan assembly. In so doing, heat is more efficiently removed from the heatsink because air inflow and air outflow traverse the cooling elements of the heatsink. In an embodiment, the fan assembly is substantially encased within the heatsink and a portion of the intake air for the fan assembly traverses the fins of the heatsink. In another embodiment, the fan assembly is entirely enclosed within the heatsink and all of the intake air for the fan assembly traverses the fins of the heatsink.

Figure 2A:
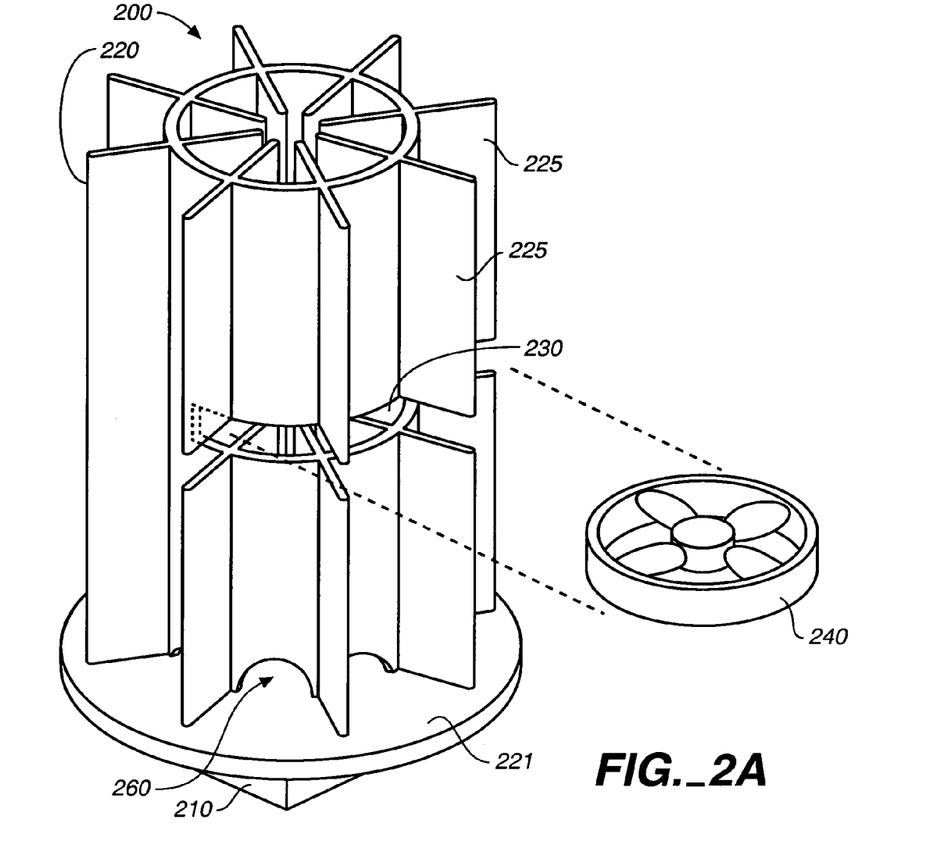
FIGS. 2A, 2B, 2C, 2D, and 2E show a heat dissipation system in accordance with embodiments of the present invention.

FIGS. 2A, 2B, 2C, 2D, and 2E show a heat dissipation 200 system in accordance with embodiments of the present invention. FIG. 2A is a perspective view of heat dissipation system 200 showing a heatsource 210, such as a microprocessor chip, is coupled with a heatsink 220. In embodiments of the present invention, heatsource 210 is thermally coupled with heatsink 220 meaning that thermal energy is transmitted between heatsource 210 and heatsink 220. In embodiments of the present invention, heatsource 210 transmits heat to heatsink 220 via conduction. Additionally, heatsource 210 may be coupled with heatsink 220 using a thermally conductive adhesive.

In embodiments of the present invention, heatsink 220 comprises a heatsink base 221 and a plurality of cooling elements 225. Cooling elements 225 may comprise fins, baffles, flanges, heatpipes, or other devices for conducting heat away from heatsink base 221 and radiating the heat to an ambient airflow. While the present embodiment recites these devices specifically for cooling elements 225, it is appreciated that other devices may be used as cooling elements 225 in accordance with embodiments of the present invention.

In the present embodiment, a cavity 230 is formed in heatsink 220. More specifically, in the embodiment of FIG. 2A a slot has been formed in cooling elements typically shown as 225. As shown in FIG. 2A, a fan assembly 240 can be inserted into slot 230 such that it is partially encased by heatsink 220. Intake air (e.g., 250 of FIG. 2C) is caused by an airflow created by fan assembly 240 to traverse cooling elements 225 prior to being exhausted from fan assembly 240 (e.g., region 226a of FIG. 2C) when the fan assembly is operating. For the sake of the present invention, the term "traverse" means that cooling elements (e.g., 225) extend into a region (e.g., 226a) and that air also passes through this region. In embodiments of the present invention, all of the intake air for fan assembly 240 traverses cooling elements 225 prior to being exhausted from fan assembly 240. As a result, heat is conveyed away from cooling elements 225 by the intake air prior to reaching fan assembly 240. Additionally, after being exhausted from fan assembly 240, the intake air again traverses the cooling elements 225 along region 226b due to the airflow created by fan assembly 240, thereby conveying more heat away from the cooling elements. In embodiments of the present invention, all of the intake air exhausted from fan assembly 240 traverses cooling elements 225 and may exit system 200 through a hole (260) in a shroud 227 of heat dissipation system 200. While the embodiment of system 200 shows shroud 227, embodiments of the present invention are not limited to the configuration shown. For example, in an embodiment of the present invention, shroud 227 may only be disposed near the top of system 200 (e.g., in the vicinity of region 226a of FIG. 2C). In another embodiment, shroud 227 may be missing entirely and cooling elements 225 are therefore only coupled with heatsink base 221. Furthermore, it is appreciated that while FIGS. 2A and 2C show fan assembly disposed horizontally, embodiments of the present invention are not limited to this configuration. For example, with reference to FIG. 2C, cavity 230 may be formed vertically in cooling elements 225 rather than horizontally. Thus, intake air 250 may flow horizontally (e.g., from left to right) rather than vertically (e.g., from top to bottom).

Figure 2B:
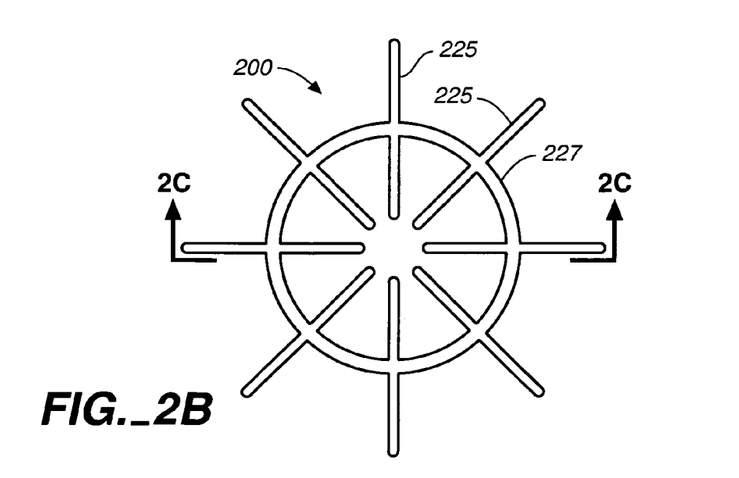
Figure 2C:
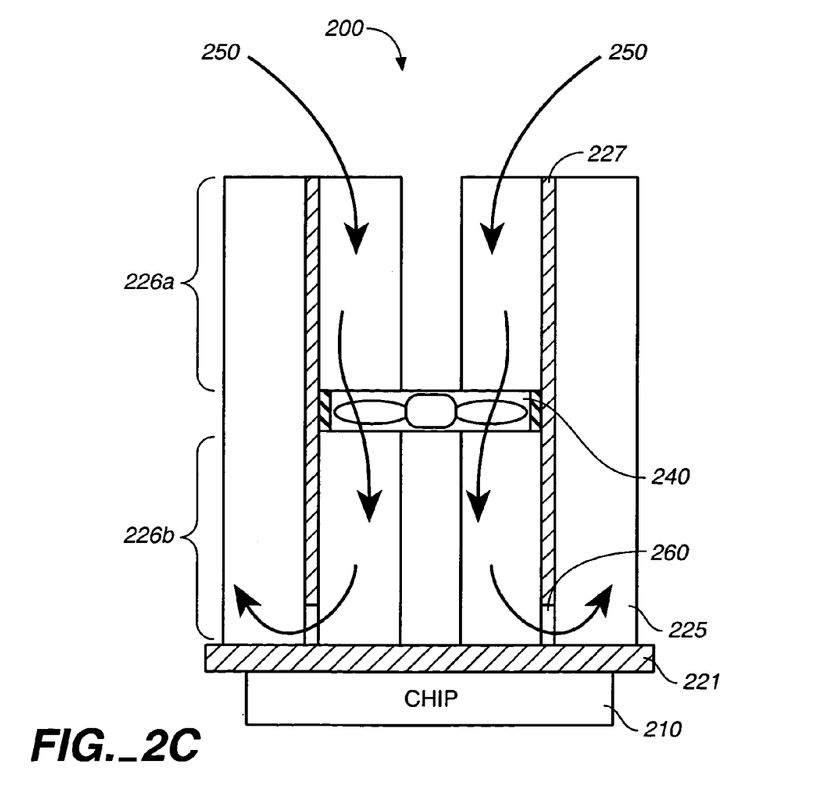
Figure 2D:
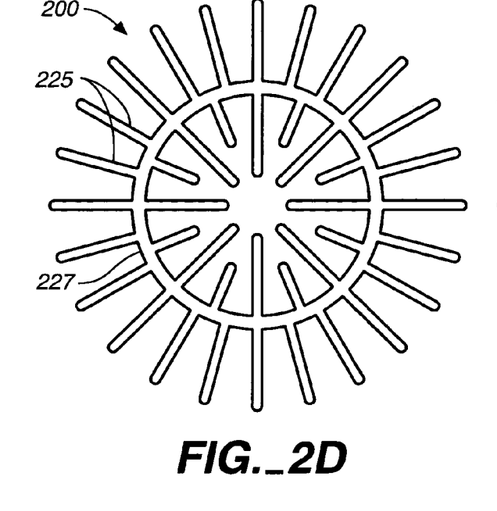
Figure 2E:
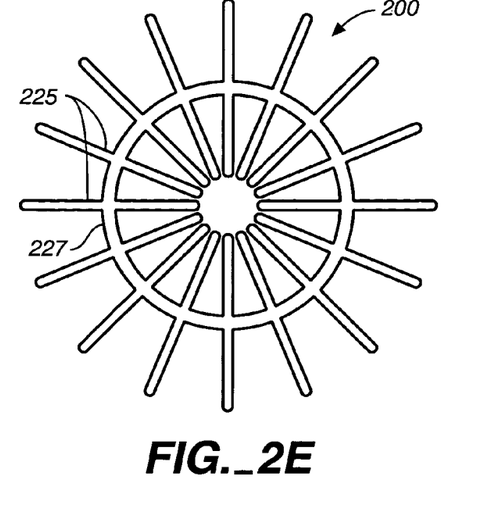

FIGS. 2B, 2D, and 2E are top views of system 200 in accordance with embodiments of the present invention showing various configurations of cooling elements 225 and shroud 227.

Embodiments of the present invention are advantageous in that the air input and output of the fan assembly 240 is directed through the center of heatsink 220. Hence embodiments of the present invention are not restricted to having only the incoming air flow or the outgoing air flow remove heat from cooling elements 225. As a result, the air input and output of the fan apparatus traverses the cooling elements 225 in a more symmetrical or uniform manner and greater heat dissipation efficiency is realized.

Figure 3A:
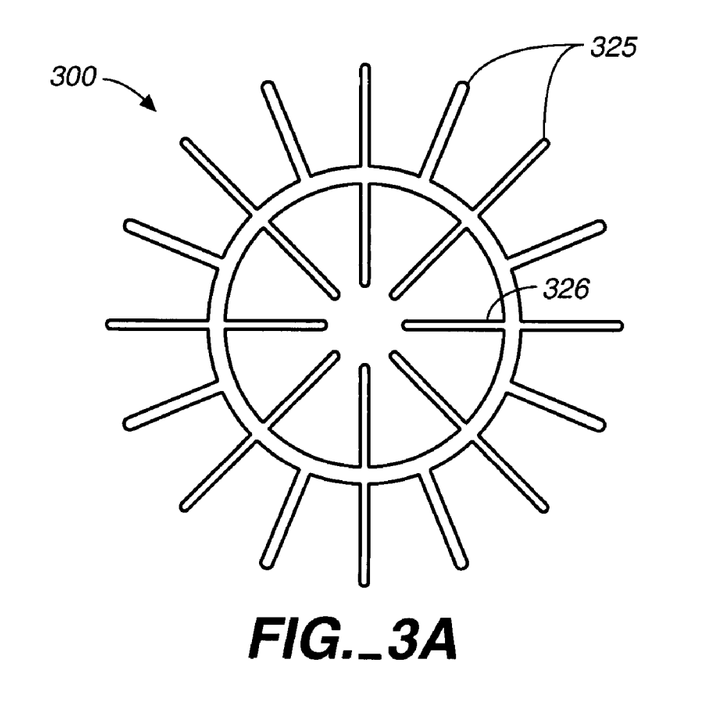
FIGS. 3A, 3B, 3C, 3D, 3E, and 3F show a heat dissipation system in accordance with embodiments of the present invention.
Figure 3B:
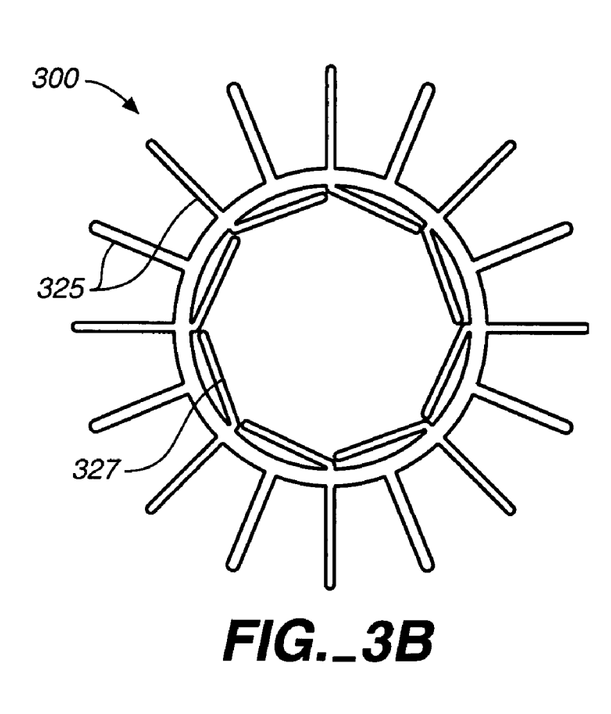

FIGS. 3A, 3B, 3C, 3D, 3E, and 3F show a heat dissipation system 300 in accordance with embodiments of the present invention. FIGS. 3A and 3B are top views of a heatsink (e.g., 320 of FIG. 3C) of system 300 showing how portions of cooling elements 325 can be moved to allow inserting a fan assembly into a cavity formed in the heatsink. As shown in FIG. 3B, portions of cooling elements 325 have been bent (typically shown as 327) which thus forms a cavity 330 within heatsink 320. In embodiments of the present invention, a fan assembly (e.g., 340 of FIG. 3D) is inserted into the cavity and the portions of cooling elements are then bent back over the fan assembly (e.g., as shown in FIG. 3A) such that the fan assembly is now partially encased within the heatsink.

Fan assembly 340 can therefore be placed into cavity 330 and portions of cooling elements 325 (e.g., portion 326 of FIG. 3A) are moved from a first position (e.g., typically shown as 327 of FIG. 3B) to a second overlying the fan assembly. In embodiments of the present invention, some or all of the cooling elements 325 may be bent as shown by 327 to allow insertion of fan assembly 340. After fan assembly 340 has been inserted into heatsink 320, portions of cooling elements 325 are then bent into position over fan assembly 340, thus partially encasing the fan assembly. When in operation, fan assembly 340 creates an airflow which causes intake air to traverse cooling elements 325 prior to being exhausted as discussed above with reference to FIG. 2C. Additionally, after being exhausted by fan assembly 340, intake air again traverses cooling elements 325 as discussed above with reference to FIG. 2C. While the present embodiment shows cavity 330 proximate to the top of heatsink 320, in embodiments of the present invention, cavity 330 can be located closer to or farther from heatsink base 321.

Figure 3C:
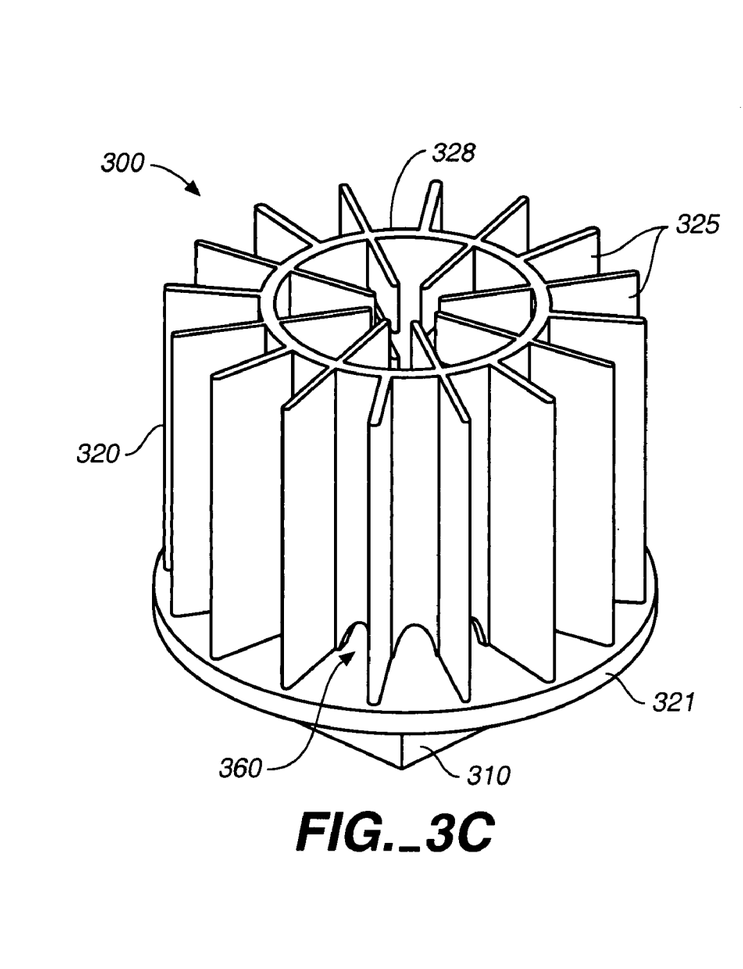

FIGS. 3C–3F are perspective views showing a sequence of operations for inserting a fan assembly into a heatsink in accordance with embodiments of the present invention. FIG. 3C shows system 300 prior to bending portions of cooling elements 325. In FIG. 3C, cooling elements 325 are coupled with a heatsink base 321 to form a heatsink 320. In system 300, heatsink 320 is coupled with heatsource 310 and conveys heat generated by heatsource 310 via conduction to cooling elements typically shown as 325. In embodiments of the present invention, cooling elements 325 may comprise fins, baffles, flanges, heatpipes, or other devices for conducting heat away from heatsink base 321 and radiating the heat to an ambient airflow. While the present embodiment recites these devices specifically for cooling elements 325, it is appreciated that other devices may be used as cooling elements 325 in accordance with embodiments of the present invention. FIG. 3C also shows a hole 360 in a shroud 328 for allowing air to be exhausted from system 300. It is appreciated that shroud 328 may be configured as described above with reference to FIGS. 2A and 2C.

Figure 3D:
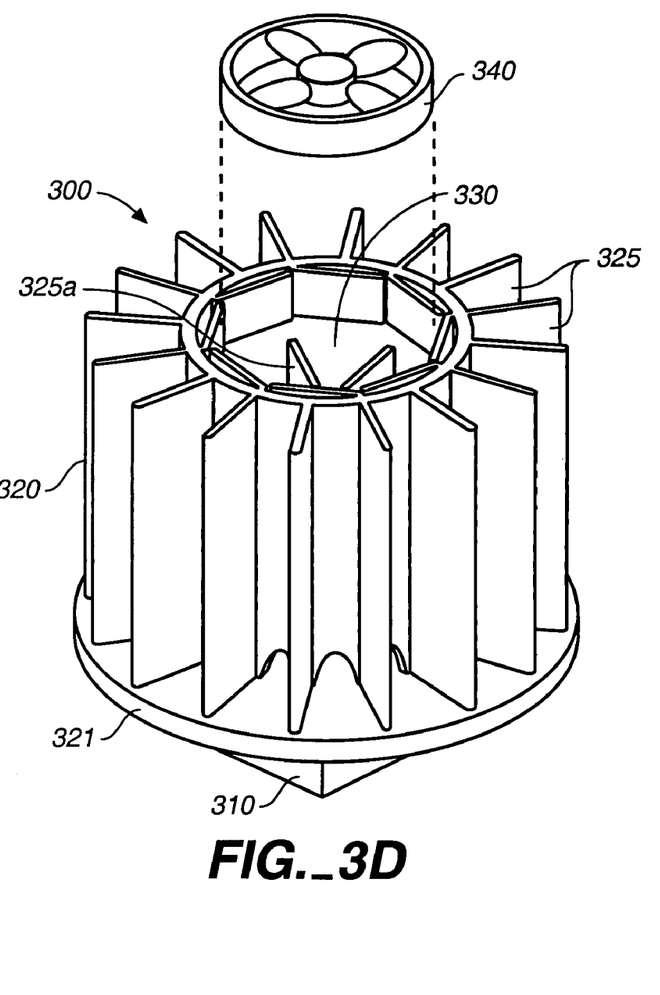

FIG. 3D shows cooling elements 325 bent to allow insertion of fan assembly 340. In embodiments of the present invention, cooling elements 325 comprise a flexible material such as metal which can be bent to the side (e.g., as shown also in FIG. 3B) to provide access to cavity 330. As shown in FIG. 3D, portions of cooling elements 325 (e.g., 325a) also extend below cavity 330 and can provide a surface upon which fan assembly 340 is placed.

Figure 3E:
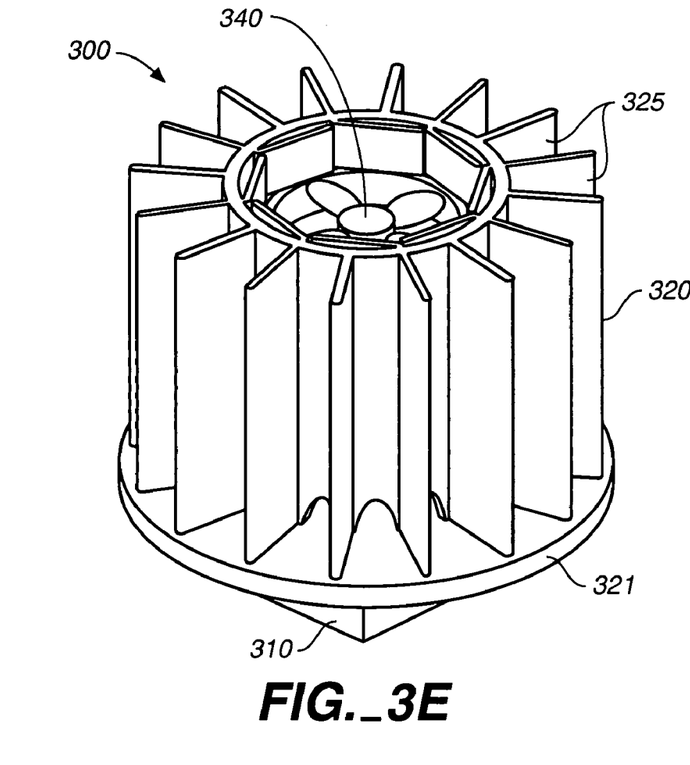

FIG. 3E shows system 300 with fan assembly 340 placed into cavity 330 and prior to bending portions of cooling elements 325 over the top of the fan assembly. In embodiments of the present invention, a fan assembly 340 is placed in cavity 330 and is thus partially encased by heatsink 320.

Figure 3F:
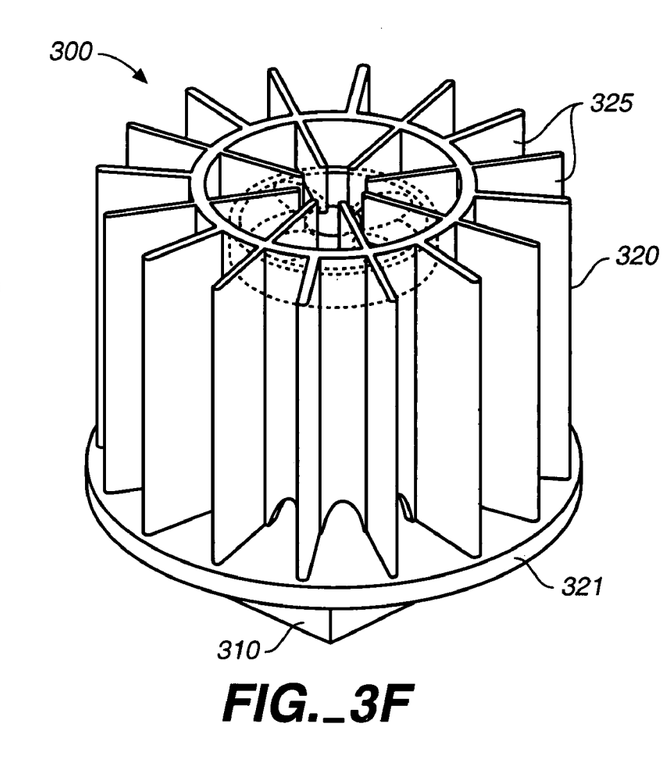

FIG. 3F shows system 300 after the portions of cooling elements 325 have been bent such that fan assembly 340 (shown by the broken lines) is now encased within the heatsink. Thus, cooling elements 325 now extend around and over cavity 330 and partially encase fan assembly 340.

Figure 4A:
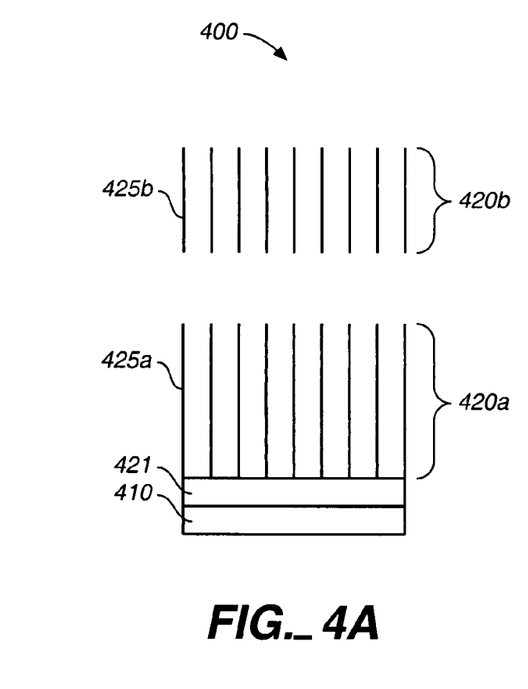
FIGS. 4A and 4B–4C are front and side sectional views respectively of a heat dissipation system in accordance with embodiments of the present invention.
Figure 4B:
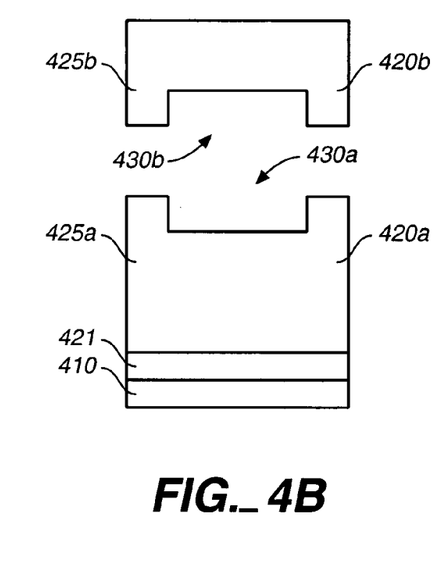
Figure 4C:
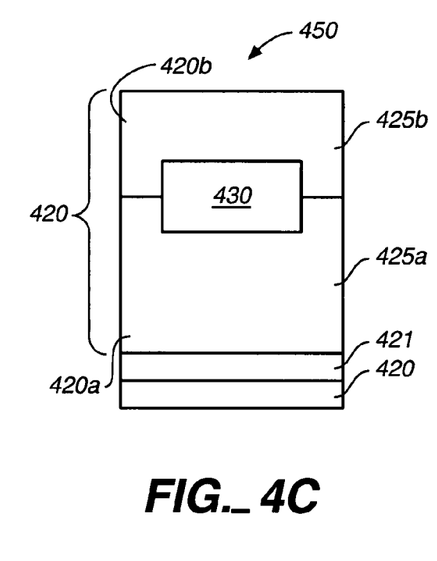

FIGS. 4A and 4B–4C are front and section views respectively of a heat dissipation system 400 in accordance with embodiments of the present invention. In the embodiment of FIGS. 4A–4C, heatsink 420 comprises a first portion 420a and a second portion 420b. Portion 420a further comprises a heatsink base 421 and a plurality of cooling elements typically shown as 425a. Portion 420b further comprises a plurality of cooling elements typically shown as 425b. In embodiments of the present invention, cooling elements 425a–425b may comprise fins, baffles, flanges, heatpipes, or other devices for conducting heat away from heatsink base 421 and radiating the heat to an ambient airflow. While the present embodiment recites these devices specifically for cooling elements 425a–425b, it is appreciated that other devices may be used as cooling elements 425a–425b in accordance with embodiments of the present invention.

With reference to FIG. 4B, portions 420a and 420b further comprise sub-cavities 430a and 430b respectively which, when portions 420a and 420b are coupled, create a cavity 430. Cavities 430a and 430b are configured for receiving a fan assembly (not shown) which is inserted into sub-cavity 430a. Portion 420a is then coupled with portion 420b. It is appreciated that for reasons of clarity, a fan assembly which is disposed in cavity 430 is not shown in FIG. 4C. In embodiments of the present invention, portions 420a and 420b can be snap fit, or joined using, for example, a thermally conductive adhesive or a mechanical fastener. When portions 420a and 420b are coupled, heatsink 420 encases the fan assembly and cooling elements 425a and 425b are thermally coupled such that heat is conveyed away from heatsink base 410 to cooling elements 420b via cooling elements 420a.

FIG. 4C shows heatsink 420 after portion 420a and portion 420b have been coupled. In the embodiment of FIG. 4C, all of the intake air (typically represented by arrow 450) traverses cooling elements 425b due to an airflow created by the fan assembly prior to being exhausted from the fan assembly (not shown) which has been inserted into cavity 430. Additionally, all of the intake air traverses cooling elements 425a after being exhausted from the fan assembly due to an airflow created by the fan assembly.

Figure 5:
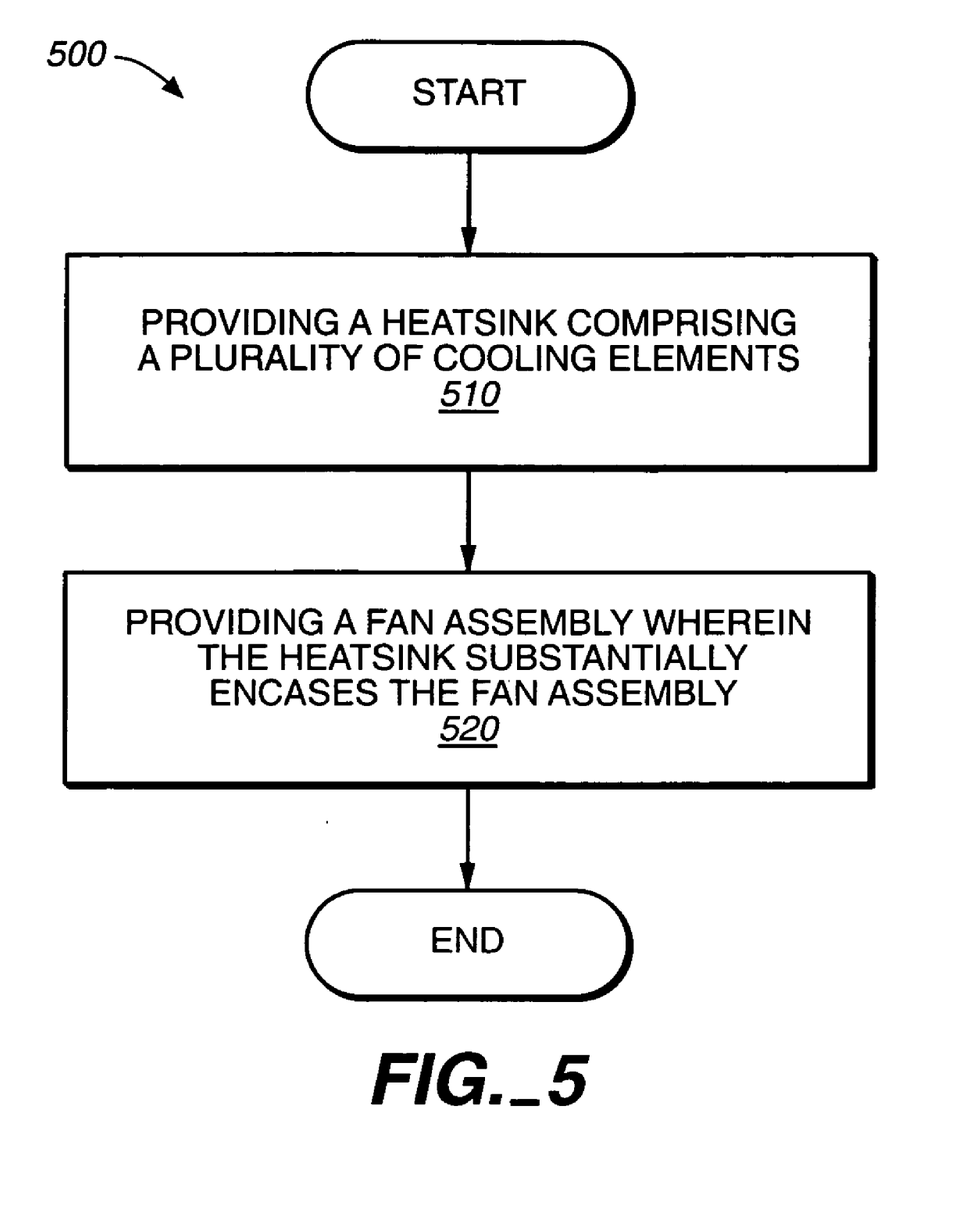
FIG. 5 is a flow chart of a method for providing a heat dissipation system in accordance with embodiments of the present invention.

FIG. 5 is a flow chart of a method 500 for providing a heat dissipation system in accordance with embodiments of the present invention. In step 510 of FIG. 5, a heatsink comprising a plurality of cooling elements is provided. As described above with reference to FIGS. 2A–2B, 3A–3B, and 4A–4C, embodiments of the present invention utilize a heatsink comprising a plurality of cooling elements (e.g., cooling elements 225, 325, and 425) coupled with a heatsink base (e.g., heatsink base 221, 321, and 421). In embodiments of the present invention, the heatsink base is coupled with and conveys heat away from a heatsource.

In step 520 of FIG. 5, a fan assembly is provided wherein the heatsink substantially encases the fan assembly. As described above, in embodiments of the present invention a cavity is formed in the plurality cooling elements such that a fan assembly inserted into the cavity is substantially or entirely encased by the heatsink. For example, in system 200 of FIGS. 2A and 2B, cavity 230 is created by forming a slot in cooling elements 225. In system 300 of FIGS. 3A and 3B, cavity 330 is created in cooling elements 325 such that fan assembly 340 can be inserted into the cavity and portions 325a of cooling elements 325 are moved from a first position to a second position overlying fan assembly 340. In so doing, fan assembly 340 is encased by heatsink 320. In system 400 of FIGS. 4A–4C, heatsink 420 comprises at least a first portion and a second portion which, when coupled create a cavity 430 into which a fan assembly is inserted. In so doing, intake air for the fan assembly first traverses the cooling elements prior to being exhausted from the fan assembly. Additionally, the intake air again traverses the cooling elements after being exhausted from the fan assembly.

Embodiments of the present invention are advantageous because a greater amount of air traverses the cooling elements when compared with conventional designs. For example, in a conventional design, the fan is placed on top of the cooling fins and only the air output from the fan traverses the cooling fins. However, much of the air output from the fan leaves the heatsink from the fans before traversing the length of the cooling elements, thus reducing the efficiency of the cooling apparatus. However, in embodiments of the present invention, the air input and output of the fan assembly is directed through the center of the heatsink mass. As a result, the air input and output of the fan apparatus traverses the cooling elements in a more symmetrical or uniform manner and greater heat dissipation efficiency is realized.

Figure 6A:
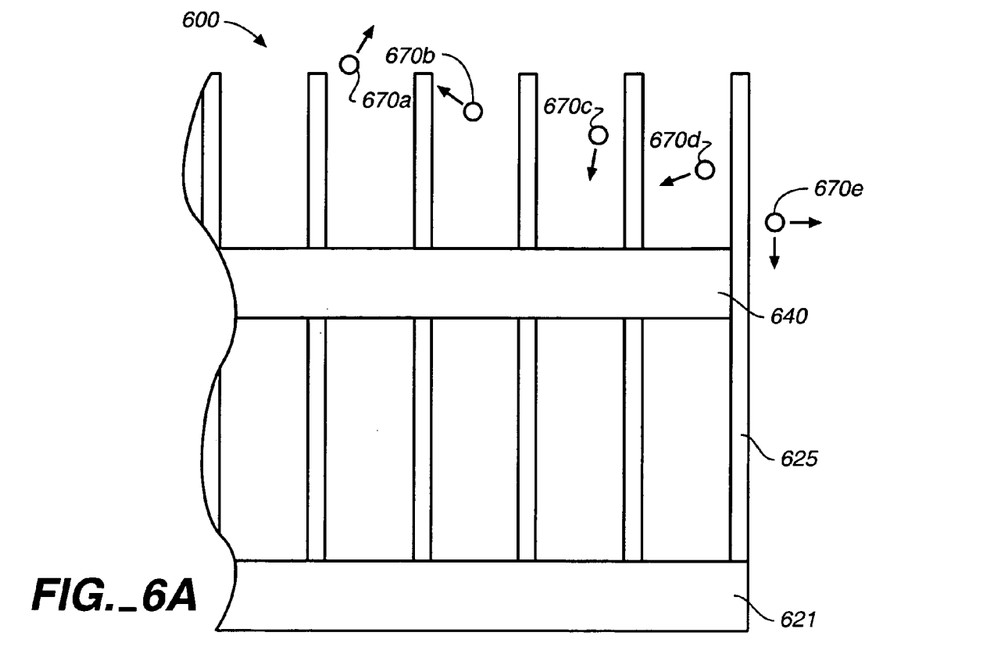
FIGS. 6A and 6B show air flow patterns around a heat dissipation system in accordance with embodiments of the present invention.
Figure 6B:
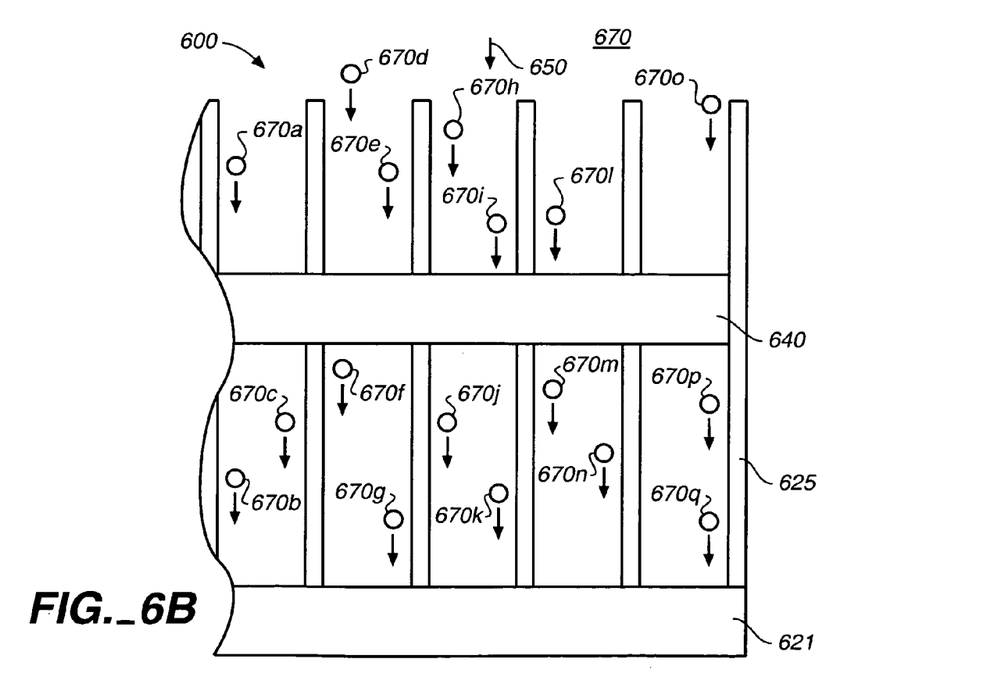

FIGS. 6A and 6B are partial side sectional views showing air flow patterns of a heat dissipation system 600 in accordance with embodiments of the present invention. FIG. 6A shows an exemplary air flow pattern prior to operating a fan apparatus 640 of heat dissipation system 600 while FIG. 6B shows an exemplary air flow pattern after operation of the fan assembly is initiated. Referring now to FIG. 6A, system 600 comprises a cooling element typically shown as 625 and a fan assembly 640. A heatsink base 621 is shown coupled with cooling element 625. FIG. 6A shows heat dissipation system 600 prior to operating fan assembly 640. It is noted that air particles (e.g., particles 670a–670e) travel in random directions relative to cooling element 625. As a result, fewer air particles (e.g., 670a and 670e) do not traverse cooling elements 625 in close enough proximity to have heat conveyed to them while air particles 670b–670d traverse cooling elements 625 in close enough proximity to have heat conveyed to them. As a result, more heat remains in cooling elements 625 and less heat is conducted away from heat dissipation system 600 by the air particles.

FIG. 6B shows heat dissipation system 600 while fan assembly 640 is operating. When fan assembly 640 is turned on, intake air, comprising air particles 670a–670q, begins flowing in the direction of arrow 650. As a result, more air particles (e.g., air particles 670a–670q) are in close enough proximity to cooling elements 625 to absorb heat therefrom and convey the heat away due to the airflow induced by fan assembly 640 prior to entering and being exhausted from fan assembly 640. In other words, intake air is caused to traverse cooling element 625 prior to being exhausted from fan assembly 640. Additionally, the intake air again traverses cooling element 625 after being exhausted from fan assembly 640 and therefore more readily transfers heat therefrom.

A method and system for dissipating heat have been described. While the present invention has been described in particular embodiments, it should be appreciated that the present invention should not be construed as limited by such embodiments, but rather construed according to the following claims.

What is claimed is:

1. A heat dissipating system comprising:
   a heatsink comprising a plurality of cooling elements; and
   a fan assembly disposed within said heatsink by placing said fan assembly within a cavity of said heatsink and moving a portion of said plurality of cooling elements from a first position to a second position overlying said fan assembly such that, when in operation, at least a portion of the intake air for said fan assembly is caused to traverse said plurality of cooling elements prior to being exhausted from said fan assembly.

2. The heat dissipating system of claim 1 wherein said fan assembly is disposed within said heatsink such that the intake air is further caused to traverse said plurality of cooling elements after being exhausted from said fan assembly.

3. The heat dissipating system of claim 1 wherein said heatsink entirely encases said fan assembly.

4. The heat dissipating system of claim 1 wherein said fan assembly is disposed within said heatsink such that all of the intake air for said fan assembly traverses said plurality of cooling elements of said heatsink prior to being exhausted from said fan assembly.

5. The heat dissipating system of claim 1 wherein said fan assembly is disposed within a cavity comprising a slot formed in said plurality of cooling elements.

6. The heat dissipating system of claim 1 wherein said heatsink comprises at least a first portion and a second portion and wherein a cavity for said fan system is created therein when said first portion and said second portion are coupled.

7. A heatsink comprising:
  a plurality of cooling elements; and
  a cavity formed in said plurality of cooling elements, wherein said cavity is formed such that a fan assembly disposed within said cavity is encased by said heatsink by placing the fan assembly within said cavity and moving a portion said plurality of cooling elements from a first position to a second position overlying the fan assembly and causes the intake air for the fan assembly to traverse said plurality of cooling elements prior to being exhausted from the fan assembly.

8. The heatsink of claim 7 wherein said cavity is formed such that the intake air for the fan assembly is further caused to traverse said plurality of cooling elements after being exhausted from the fan assembly.

9. The heatsink of claim 7 wherein said heatsink entirely encases the fan assembly.

10. The heatsink of claim 7 wherein the fan assembly is disposed within said heatsink such that all of the intake air for the fan assembly traverses said plurality of cooling elements of said heatsink prior to being exhausted from the fan assembly.

11. The heatsink of claim 7 wherein said cavity comprises a slot formed in said plurality of cooling elements.

12. The heatsink of claim 7 wherein said heatsink comprises at least a first portion and a second portion and wherein said cavity is created when said first portion and said second portion are coupled.

13. A method for providing a heat dissipation system comprising:
  providing a heatsink comprising a plurality of cooling elements;
  providing a fan assembly disposed within said heatsink
  placing said fan assembly within said cavity and moving a portion of said plurality of cooling elements from a first position to a second position overlying said fan assembly wherein said heatsink substantially encases said fan assembly such that, when in operation, at least a portion of the intake air for said fan assembly is caused to traverse said plurality of cooling elements prior to being exhausted from said fan assembly.

14. The method as recited in claim 13 wherein said providing a fan assembly further comprises:
  causing the intake air for said fan assembly to traverse said plurality of cooling elements after being exhausted from said fan assembly.

15. The method as recited in claim 13 wherein said fan assembly is disposed within said heatsink such that all of the intake air for said fan assembly traverses said plurality of cooling elements of said heatsink prior to being exhausted from said fan assembly.

16. The method as recited in claim 13 wherein said providing a heatsink further comprises:
  providing a cavity in said heatsink comprising a slot formed in said plurality of cooling elements.

17. The method as recited in claim 13 wherein said heatsink comprises at least a first portion and a second portion and wherein a cavity is created when said first portion and said second portion are coupled.

* * * * *